United States Patent [19]

Takahashi et al.

[11] 4,367,483

[45] Jan. 4, 1983

[54] OPTICAL SEMICONDUCTOR DEVICE

[75] Inventors: Takeo Takahashi, Takasaki; Kazuhiro Kurata, Hachioji; Yuichi Ono, Tokyo; Kazuhiro Ito, Tokyo; Makoto Morioka, Tokyo; Mitsuhiro Mori, Kokubunji; Ginro Takemura, Okegawa; Makoto Sakamoto, Maebashi; Masahiro Ichiki, Tamamuramachi; Youichi Yasuda, Takasaki; Hirobumi Ouchi, Hino, all of Japan

[73] Assignee: Hitachi, Ltd., Tokyo, Japan

[21] Appl. No.: 192,991

[22] Filed: Oct. 2, 1980

[30] Foreign Application Priority Data

Oct. 3, 1979 [JP] Japan ............................... 54-126842

[51] Int. Cl.$^3$ ........................................... H01L 31/12
[52] U.S. Cl. ..................................... 357/19; 357/17; 357/30; 372/50

[58] Field of Search ............... 357/19, 17, 30; 372/50

[56] References Cited

U.S. PATENT DOCUMENTS 4,216,485 8/1980 Page ..................................... 357/19
4,275,404 6/1981 Cassiday ............................. 357/19

Primary Examiner—Martin H. Edlow
Attorney, Agent, or Firm—Antonelli, Terry & Wands

[57] ABSTRACT

An optical semiconductor device includes a light emitting element disposed on a silicon sub-mount having a light receiving element formed in a surface region. By virtue of integral arrangement of the light emitting element and the light receiving element, a single lens can be used for both optical transmission and optical reception, whereby an optical communication system can be manufactured very inexpensively. Further, transmission and reception can be carried out simultaneously.

7 Claims, 3 Drawing Figures

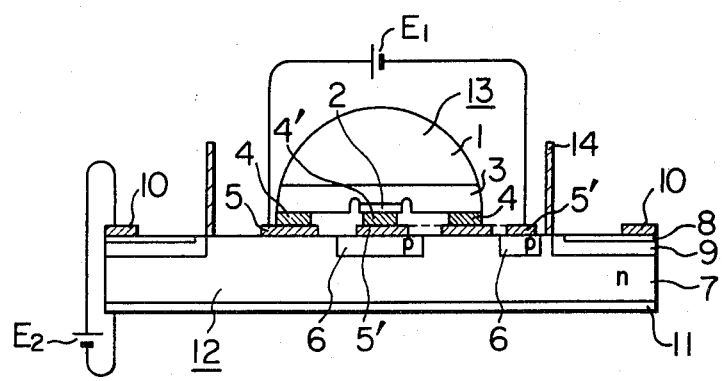
F I G. 1
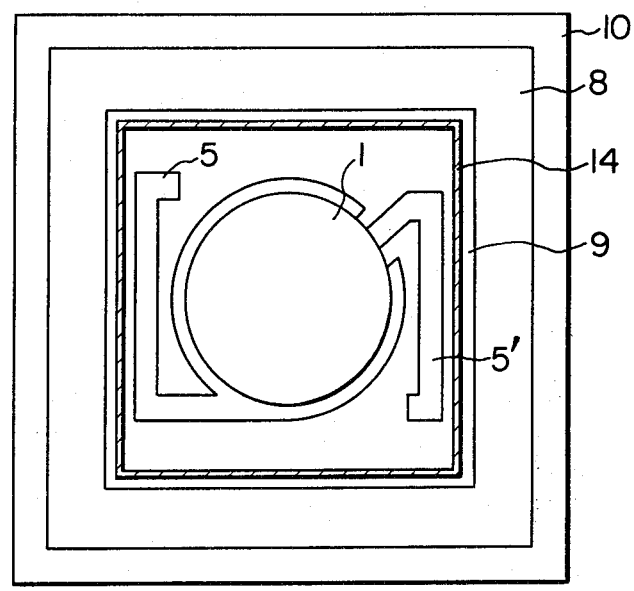
F I G. 2
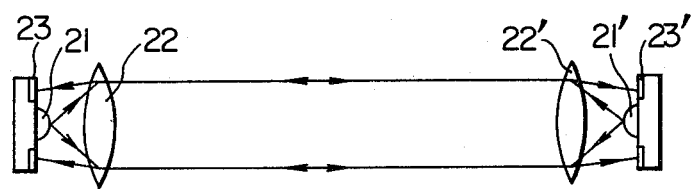
F I G. 3

OPTICAL SEMICONDUCTOR DEVICE

BACKGROUND OF THE INVENTION

1. Field of the Invention

The present invention relates generally to an optical semiconductor device. More particularly, the invention concerns the optical semiconductor device in which an optical transmitting element and a light receiving element are formed integrally with each other and which is advantageously suited for optical communication through space serving as a transmitting medium.

2. Description of the Prior Art

Owing to remarkable progress in the development of light emitting elements and light receiving elements in recent years, the so-called optical communications in which light is made use of as the information carrier tend to be increasingly and widely employed.

Among the others, in the case of the optical communication in which space is used as the transmitting medium, the light emitting element is activated in accordance with information to be transmitted to thereby emit light which is then radiated into space in a form of a collimated light beam through an optical lens. At the side of a receiving station, the light beam as received is focussed on the light receiving element through a lens to restore the incoming information.

In order to allow the bi-directional optical communication to be realized, a pair of such light transmission and reception channels are of course required. In this connection, it is noted that the lens having a large diameter of the order of 30 cm has to be used for the optical communication over a long distance (e.g. about several kilometers). Consequently, the optical communication system will then be very expensive. Further, complicated and troublesome maintenance and adjustments such as optical-axis-matching or the like are involved. In these respects, there has been a great demand for improvement.

To this end, it has been proposed that the light emitting element and the light receiving element are combined integrally with each other, wherein a single convex lens is used to serve for both the light transmission and the light reception. In this case, the total number of the convex lenses as required for the optical communication is decreased to a half of that required in the optical communication system where the light emitting element and the light receiving element are separately provided at each of the terminals. The maintenance procedures will then be improved.

However, the optical semiconductor device incorporating therein integrally the light emitting or transmitting element and the light receiving element has heretofore been fabricated by forming successively a number of compound semiconductor layers on a GaAs-substrate through epitaxial growth in a laminated multi-layer structure in which a light emitting pn-junction and a light receiving pn-junction are present, as is disclosed in Japanese Laid-Open Patent Application No. 48493/1979, for example. Consequently, manufacture of such integrated optical semiconductor device requires much complicated fabricating processes. Besides, because the light emitting pn-junction and the light receiving pn-junction are formed in a common region in an overlapping relation to each other with a small distance therebetween, the light transmitting or sending operation and the light receiving operation can not be carried out simultaneously, involving great difficulty in attaining a high efficiency in the optical communication.

SUMMARY OF THE INVENTION

An object of the present invention is therefore to solve the problems of the hitherto known device described above and provide an optical semiconductor device which allows the optical communication system to be realized inexpensively with the number of expensive lenses being decreased considerably.

Another object of the present invention is to provide an optical semiconductor device capable of constituting an optical communication system which is very much simplified in operation and maintenance as compared with the hitherto known system.

In view of the above and other objects which will become more apparent as description proceeds, it is proposed according to an aspect of the invention to constitute the semiconductor device by disposing a light emitting element on a silicon sub-mount which has a photodiode formed in a surface region.

BRIEF DESCRIPTION OF THE DRAWING

FIG. 1 is a sectional view showing an optical semiconductor device according to an embodiment of the invention.

FIG. 2 is a top plan view of the device shown in FIG. 1.

FIG. 3 schematically illustrates an optical communication effected with the aid of the optical semiconductor devices according to the invention.

DESCRIPTION OF THE PREFERRED EMBODIMENTS

Referring to FIGS. 1 and 2 which show a structure of the optical semiconductor device according to an embodiment of the invention in a sectional view and a top plan view, a light emitting diode element 13 of a dome-like form is disposed on a sub-mount 12 which includes an n-type single crystal silicon substrate 7 having a bottom surface provided with an electrode 11 of a metal exhibiting a high electric conductivity and a top surface formed with a silicon PIN photodiode (light receiving element) by a p-type layer 8 and an i-type layer 9. The i-type layer 9 and the p-type layer 8 can be formed by introducing boron, aluminium, indium or gallium into the substrate 7 at desired surface regions through ion implantation, thermal diffusion or the like process well known in the art. An anode electrode 10 is deposited on the p-type layer 8. A voltage required for the PIN photodiode to be operated is applied across the electrodes 10 and 11 from a power supply source $E_2$.

The light emitting diode itself is one of known light emitting diodes of a composition generally represented $Ga_{1-x}Al_xAs$. By varying the mixed crystal ratio x, the wavelength of light emitted by the diode can be correspondingly varied. For example, when the mixed crystal ratio x is selected equal to 0.075, the center wavelength of emitted light is of 8,300 Å. A current required for operation of the light emitting diode 13 is supplied from a power supply source $E_1$ electrically connected to an anode 5 and a cathode 5' of the diode 13. Because a light emitting portion of a p-type thick film 1 of $Ga_{1-x}Al_xAs$ is configured in a dome-like form, light emitted from the light emitting diode 13 is radiated into space with an improved directivity.

The anode electrode 5 and the cathode electrode 5' are usually made of gold. When these electrodes 5 and 5' are connected to the power supply source $E_1$ as shown in FIG. 1, holes injected into the anode 5 will not flow through the sub-mount 12 because of a positive potential at the n-type substrate 7 but flow into the p-type $Ga_{1-x}Al_xAs$-layer 3 of the light emitting diode 13 through a p-type ohmic contact 4.

On the other hand, electrons injected into the cathode 5' will not flow through the sub-mount 12 because the p-type region 6 formed in the surface region of the sub-mount 12 and the n-type substrate are reverse-biased but flow through the n-type ohmic contact 4 and the n-type $Ga_{1-x}Al_xAs$-layer 2 of the light emitting diode into the p-type $Ga_{1-x}Al_xAs$-layer 3 where the electrons are combined with the holes to emit light. Light thus emitted is radiated outwardly through the p-type $Ga_{1-x}Al_xAs$-layer 1 realized in the dome-like configuration.

If a portion of light emitted from the light emitting diode 13 impinges on the p-type layer 8 and the i-type layer 9 of the PIN diode formed in a manner to enclose the light emitting diode 13, pairs of electron and hole will then be produced, resulting in that the electrons and the holes as produced will move toward the n-type layer 7 and the p-type layer 8, respectively, to give rise to a current flow, because a reverse bias voltage is applied to the PIN diode from the power supply source $E_2$. In the case of the illustrated device, with a view to suppressing the undesirable phenomenon described just above, the light emitting diode 13 is enclosed by a partition wall 14, whereby light emitted from the light emitting diode 13 is prevented from impinging on the PIN diode.

For preventing light emitted by the light emitting diode from impinging on the light receiving element, various measures other than the partition wall described above may be adopted.

For example, the operations of the light emitting diode and the light receiving element may be changed over with each other on a predetermined time-series base so that the light receiving element is inhibited from operation during the light emitting operation of the light emitting diode.

Further, arrangement may be made such that the wavelength of light to be transmitted differs from that of received light and that the light receiving element can respond only to the received light wave. Differentiation of the wavelength of emitted light from that of received light can be accomplished by varying appropriately the mixed crystal ratio of the compound semiconductor constituting the light emitting diode. Further, an appropriate interference filter may be disposed in front of the light receiving element to thereby cut off the light rays of other wavelengths than the desired one.

FIG. 3 schematically illustrate a system of an optical communication of a space transmission type utilizing the optical semiconductor devices embodied according to the invention.

Referring to FIG. 3, light emitted from a light emitting diode 21 is collimated by a lens system 22 into a collimated light beam to be radiated into space. At the counterpart station, the received light beam is focussed onto a light receiving element 23' through a lens 22'.

In a similar manner, the light beam produced from a light emitting diode 21' of the counterpart unit is received by a light receiving element 23, whereby optical communication is carried out through space serving as the transmitting medium.

Although light emitted from the light emitting diode is collimated by the lens, it is impossible to obtain a perfectly collimated light beam without any expansion because of inherent characteristics of light. For example, a light beam obtained by collimating light emitted from the light emitting diode of the sender station and having a beam diameter of 15 cm may be expanded to a beam diameter of 2 m to 3 m at a location distanced from the sender by 1 km. Consequently, the light beam passing through the lens system at the receiving side will not be focussed on the light emitting diode disposed at the center portion of the sub-mount but impinge on the light receiving element disposed so as to enclose the light emitting diode to be detected by the former. However, since the light intensity for a unit area is reduced because of the diametrical expansion of the transmitted light beam, it is required to use the receiving lens of a diameter as large as possible to thereby increase the ratio of light which impinges on the light receiving element.

For the reasons described above, a large lens having a diameter of the order of 30 cm is commonly used as the lens for receiving the incoming light beam. In this conjunction, it will be appreciated that, according to the invention, the light emitting element and the light receiving element are combined integrally with each other with a single lens being used for both the optical transmission and the optical reception. In other words, the number of lenses as required to be used in the optical communication system which employs the optical semiconductor devices according to the invention can be reduced to a half of the number of lenses employed in the conventional optical communication system where separate lenses are used for optical transmission and reception, respectively. When considering the fact that the lens of such large diameter is very expensive, it will be easily understood what a great advantage the present invention brings about in practical applications.

Further, due to the integrated structure of the light emitting element and the light receiving element according to the invention, it is possible to adjust both of these elements simultaneously through a single adjustment process. In contrast, in the case of the hitherto known devices, it has been necessary to make adjustment separately for optical transmission and optical reception. It will thus be appreciated that operation, maintenance and adjustment of the optical communication system can be much facilitated and simplified according to the invention as compared with the hitherto known systems.

Additionally, due to such arrangement that the light emitting diode is disposed on the sub-mount having the light receiving element formed in the surface region, it is possible to carry out simultaneously the transmission and the reception by operating simultaneously the light emitting diode and the light receiving element. Besides, the optical semiconductor device according to the invention can be manufactured in a much simplified manner, since pn-junctions for the light emission and the light reception need not be formed in one and the same element.

In the case of the illustrated embodiment, the light emitting diode is enclosed by the PIN photodiode of a square form. However, it goes without saying that the PIN photodiode may take other desired forms such as ring-like form or the like. Further, the enclosing PIN photodiode may be formed with gaps at desired locations without involving any adverse influences.

Further, since the fundamental requirement is that both the light emitting element and the light receiving element be formed on a same substrate (i.e., the sub-mount) so that a simple lens may serve for optical transmission and optical reception, it is not always necessary that the PIN photodiode is disposed so as to enclose the light emitting diode. However, the disposition of the PIN photodiode around the light emitting diode is most preferable for the light receiving operation.

For the light emitting diode according to the invention, various visible light emitting diodes as well as infrared light emitting diode can be employed. Above all, the infrared light emitting diodes of the $Ga_{1-x}Al_x$-As-series are very preferable for use as the light emitting diode in the optical semiconductor device according to the invention in view of the great output power permitting an extended coverage range.

Further, other elements than the silicon PIN photodiode can also be used as the light receiving element.

As will be appreciated from the foregoing description, a single optical system is sufficient for the optical communication through space transmission according to the teaching of the invention. Thus, the optical communication system can be manufactured very inexpensively over the higherto known ones. Besides, adjustment and maintenance can be performed without requiring troublesome precedures.

As an attempt to decrease the number of the lenses, there has been proposed a unique lens which exhibits two different focal lengths at a center portion and a peripheral portion so as to produce a pair of focal points at different points in a plane, wherein the light emitting element is disposed at one focal point while the light receiving element is located at the other focal point. Since, such a lens is very expensive, the expense of this lens serves to cancel out the advantage obtained by reducing the number of lenses.

In contrast, the present invention does not require the use of such an expensive unique lens and thus allows the optical communication system to be implemented at low cost while facilitating the adjustment and maintenance to great advantages in practical applications.

We claim:

1. An optical semiconductor device comprising an optical transmitting element which is disposed on a sub-mount of silicon having a light receiving element formed in a surface region, and means for preventing light produced by said optical transmitting elements from impinging on said light receiving element.

2. An optical semiconductor device according to claim 1, wherein a p-type ohmic contact and an n-type ohmic contact of said optical transmitting element are electrically connected to an n-type region and a p-type region of said silicon sub-mount, respectively.

3. An optical semiconductor device according to claim 1 or 2, wherein said optical transmitting element is substantially surrounded by said light receiving element.

4. An optical semiconductor device according to claim 1 or 2, wherein said optical transmitting element is constituted by a light emitting diode of $Ga_{1-x}Al_xAs$-series.

5. An optical semiconductor device according to claim 3, wherein said optical transmitting element is constituted by a light emitting diode of $Ga_{1-x}Al_xAs$-series.

6. An optical semiconductor device according to claim 1 or 2, wherein said light receiving element is constituted by a silicon PIN photodiode.

7. An optical semiconductor device according to claim 3, wherein said light receiving element is constituted by a silicon PIN photodiode.

* * * * *